United States Patent
Foote

(10) Patent No.: US 7,348,639 B1
(45) Date of Patent: Mar. 25, 2008

(54) METHOD FOR PROVIDING A DEEP CONNECTION TO SUBSTRATE OR BURIED LAYER IN A SEMICONDUCTOR DEVICE

(75) Inventor: Richard W. Foote, Kennedale, TX (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 11/800,721

(22) Filed: May 7, 2007

Related U.S. Application Data

(62) Division of application No. 10/937,154, filed on Sep. 7, 2004, now Pat. No. 7,262,111.

(51) Int. Cl.
  *H01L 29/76* (2006.01)
  *H01L 29/94* (2006.01)
  *H01L 31/00* (2006.01)

(52) U.S. Cl. ............... 257/374; 257/510; 257/E21.545; 257/E21.546

(58) Field of Classification Search ................ 257/374, 257/510, E21.545, E21.546
See application file for complete search history.

(56) References Cited

U.S. PATENT DOCUMENTS

| | | | |
|---|---|---|---|
| 4,140,558 A | 2/1979 | Murphy et al. | |
| 5,780,340 A | 7/1998 | Gardner et al. | |
| 6,833,592 B2 * | 12/2004 | Lee | 257/372 |
| 6,927,459 B2 * | 8/2005 | Hokazono et al. | 257/368 |
| 6,958,518 B2 | 10/2005 | Wylie | |
| 7,223,647 B2 * | 5/2007 | Hsu et al. | 438/199 |

* cited by examiner

*Primary Examiner*—Michelle Estrada

(57) ABSTRACT

A system and method is disclosed for providing a deep connection to a substrate or buried layer of a semiconductor device. Three shallow trenches are etched halfway through a layer of epitaxial silicon that is located on a substrate. A second doped layer is created in the epitaxial silicon layer at the bottom of the central shallow trench. First and third doped layers are created in the epitaxial silicon layer adjacent to the central shallow trench. An oxide layer is then deposited to fill the three trenches. The second doped layer is diffused vertically down to the substrate. The first and third doped layers are diffused vertically down to the second doped layer. Lateral diffusion of the first and third doped layers is constrained by the oxide layer in the three trenches.

21 Claims, 9 Drawing Sheets

METHOD FOR PROVIDING A DEEP CONNECTION TO SUBSTRATE OR BURIED LAYER IN A SEMICONDUCTOR DEVICE

This application is a divisional of prior U.S. patent application Ser. No. 10/937,154 filed on Sep. 7, 2004 now U.S. Pat. No. 7,262,111.

TECHNICAL FIELD OF THE INVENTION

The present invention is generally directed to manufacturing technology for semiconductor devices and, in particular, to a system and method for providing a deep connection to a substrate or buried layer of a semiconductor device.

BACKGROUND OF THE INVENTION

Individual electrical components of a semiconductor device were originally integrated on a silicon wafer by forming a vertical back to back diode between the components. This was done by forming a lightly doped epitaxial layer ("epi" layer) over a substrate of the opposite doping type. Then a deep junction of the same type as the substrate was diffused down from the top of the epi layer to the substrate.

In this way two back to back diodes were formed from the epi layer on one side of the deep junction to the epi layer on the other side. Because the junction had to be driven all the way down through the epi layer to the substrate, and because the diffusion process proceeds in all directions, this method required a great deal of space to implement. Because the electrical components must be spaced away from the heavily doped junctions there had to be sufficient space provided for the lateral diffusion of the junction as the junction was driven down to the substrate. The back to back diode method did, however, provide a way to connect the front of the wafer to the substrate.

The local oxidation of silicon (LOCOS) method was also later used to isolate the individual electrical components in a semiconductor wafer. The LOCOS method, however, only provides surface isolation. Therefore, electrical components that require deep isolation are not isolated using the LOCOS method.

Shallow trench isolation has been used to replace the LOCOS method of isolation. Shallow trench isolation provides isolation in a more space efficient manner than LOCOS isolation. But because LOCOS isolation only provides surface isolation an additional method is required to provide deep isolation. Typically, when deep isolation is required, a deep trench is used in conjunction with a shallow trench. The combination of the deep trench and the shallow trench does not provide a method of connecting to the substrate.

Therefore, there is a need in the art for a system and method for providing a deep connection to a substrate or buried layer of semiconductor device. There is also a need in the art for a system and method for combining shallow trench isolation with partial deep diffusion to provide a deep connection to a substrate or buried layer of a semiconductor device.

SUMMARY OF THE INVENTION

To address the above-discussed deficiencies of the prior art, it is a primary object of the present invention to provide a system and method for providing a deep connection to a substrate or buried layer of a semiconductor device.

In one advantageous embodiment of the present invention a semiconductor device is constructed in the following manner. A substrate of a semiconductor device is provided and an epitaxial silicon layer is deposited on the substrate. An optional silicon oxide and nitride layer may be deposited oh the epitaxial silicon layer. Then a first photoresist layer is deposited on the epitaxial silicon layer (or the optional silicon oxide and nitride layer).

Then the first photoresist layer is patterned to form three apertures through the first photoresist layer. Then three shallow trenches are etched in the epitaxial silicon layer through the three apertures approximately halfway down through the thickness of the epitaxial silicon layer. Then the first photoresist layer is removed and a second photoresist layer is deposited over the epitaxial silicon layer (and the optional silicon oxide and nitride layer if it is present). Then the second photoresist layer is patterned to remove the second photoresist layer from the second (central) shallow trench.

Then portions of the silicon oxide and nitride layer (if present) that are adjacent to the second (central) shallow trench are etched away. Portions of the epitaxial silicon layer that are adjacent to the second (central) shallow trench are doped to created a first doped layer and a third doped layer. A portion of the epitaxial silicon layer that is located at the bottom of the second (central) shallow trench is doped to create a second doped layer. Then the second photoresist layer is removed and an oxide layer is deposited over the three shallow trenches. The oxide layer is also deposited over the epitaxial silicon layer (or the silicon oxide and nitride layer if it is present).

The second doped layer is then diffused vertically down to contact the substrate (or buried layer). The second doped layer also diffuses laterally into the epitaxial silicon layer until the vertical diffusion of the second doped layer reaches the substrate (or buried layer). The first and third doped layers are diffused vertically down to contact the second doped layer. The lateral diffusion of the first and third doped layers is constrained by the presence of the oxide layer in the three trenches. The merger of the first, second and third doped layers provides a deep connection structure that reaches down to the substrate (or buried layer).

In this advantageous embodiment of the invention the vertical diffusion of the second doped layer need only extend through approximately one half of the thickness of the epitaxial silicon layer. Therefore the lateral diffusion of the second doped layer occupies less time than the time required for a prior art doped layer to diffuse through the whole thickness of a similar epitaxial silicon layer.

This means that the lateral diffusion of the second doped layer into the epitaxial silicon layer occupies less lateral space than would a lateral diffusion of a typical prior art doped layer. The system and method of the present invention is therefore capable of providing a deep connection in a semiconductor device in which less lateral space is required compared to prior art methods. In addition, the system and method of the present invention is capable of providing a deep connection in a semiconductor device in which less thermal budget is required compared to prior art methods.

It is an object of the present invention to provide a system and method for providing a deep connection structure in a semiconductor device.

It is also an object of the present invention to provide a system and method for providing a deep connection structure in a semiconductor device in which less lateral space is required than the amount of lateral space required by prior art methods.

It is yet another object of the present invention to provide a system and method for providing a deep connection structure in a semiconductor device in which less thermal budget is required when compared to the amount of thermal budget required by prior art methods.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior uses, as well as future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

Figure 1:
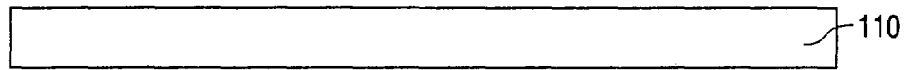
FIGS. 1 through 10 illustrate successive stages in the construction of an exemplary prior art structure that forms a deep connection to a buried layer of a semiconductor device.

FIGS. 1 through 27, discussed below, and the various embodiments used to describe the principles of the present invention in this patent document are by way of illustration only and should not be construed in any way to limit the scope of the invention. Those skilled in the art will understand that the principles of the present invention may be implemented in any type of suitably arranged semiconductor device.

To simplify the drawings the reference numerals from previous drawings will sometimes not be repeated for structures that have already been identified.

Figure 2:
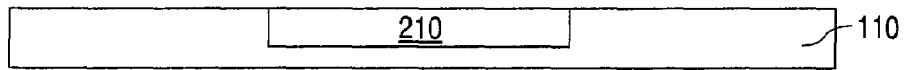

FIGS. 1 through 10 illustrate successive stages in the construction of an exemplary prior art structure that forms a deep connection to a buried layer of a semiconductor device. As shown in FIG. 1, the construction of the prior art structure begins by providing substrate layer 110. In the present example substrate 110 comprises a wafer of P silicon. As shown in FIG. 2, a buried layer 210 is formed in substrate 110. In the present example buried layer 210 comprises an N+ buried layer. The N+ buried layer 210 is formed by conventional means such as photolithography and doping with optional etching and diffusion as needed.

Figure 3:
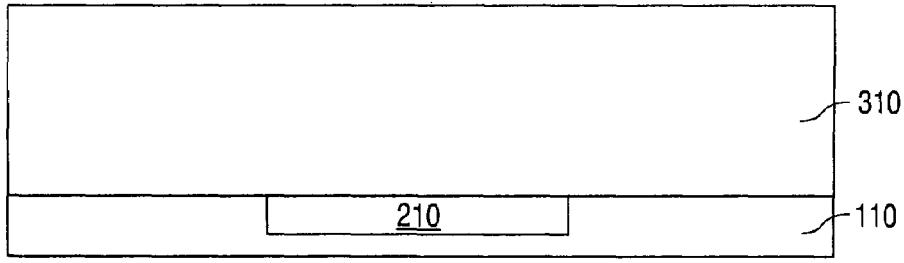
Figure 4:
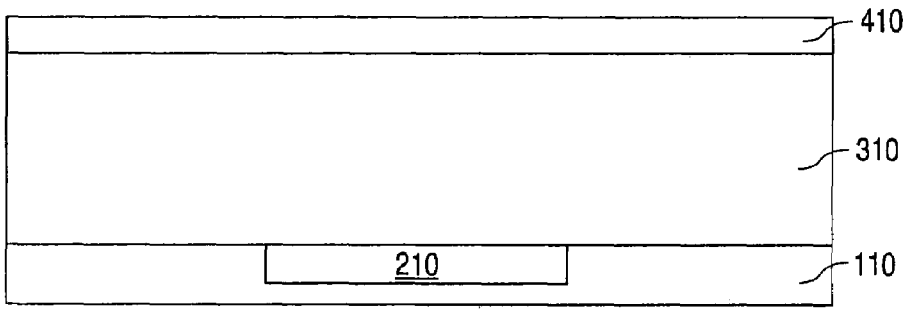

As shown in FIG. 3, an epitaxial silicon layer 310 is placed over the substrate 110 and buried layer 210. In the present example the epitaxial silicon layer 310 comprises an N epitaxial silicon layer. As shown in FIG. 4, a silicon oxide layer 410 is placed over the N epitaxial silicon layer 310. The placement of the silicon oxide layer 410 over the N epitaxial silicon layer 310 is an optional step.

Figure 5:
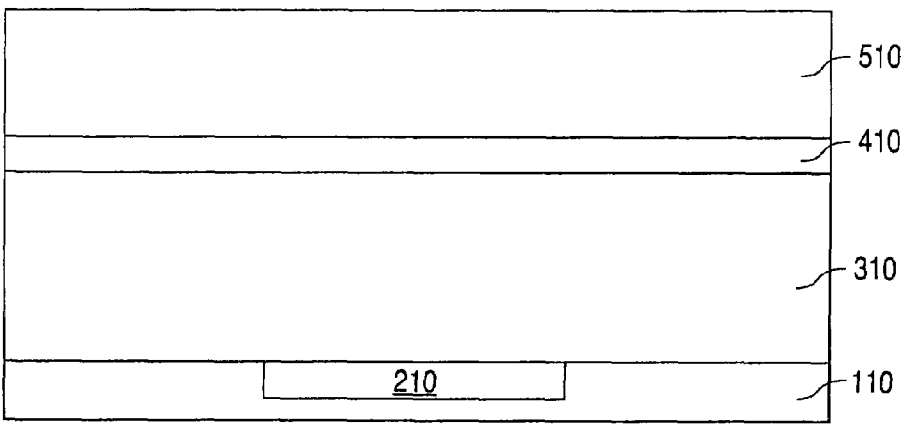
Figure 6:
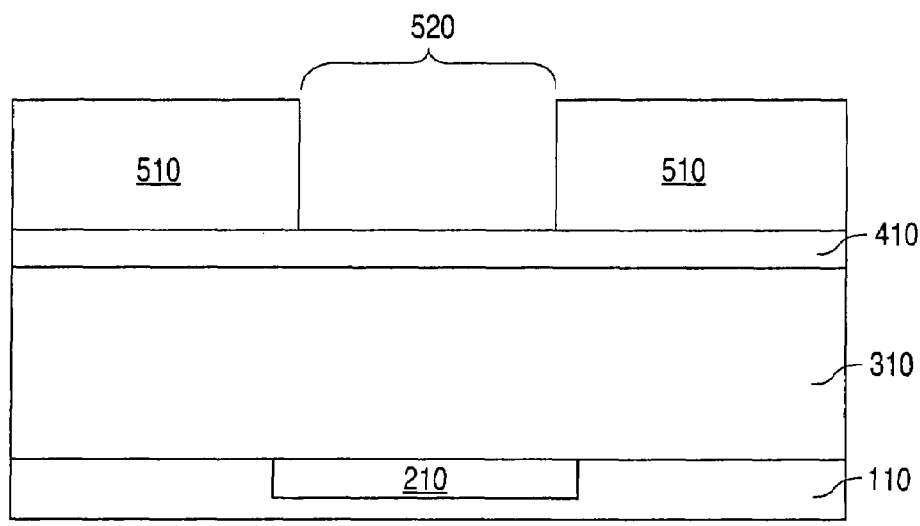
Figure 7:
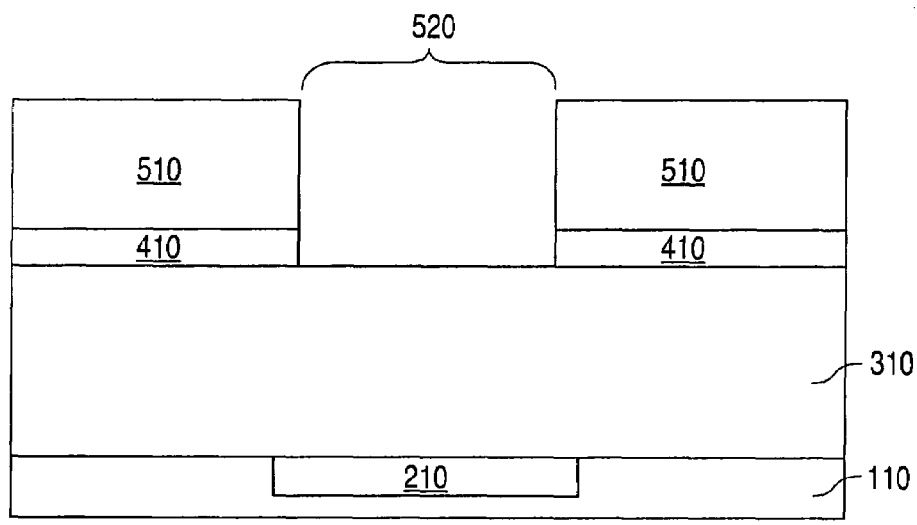

As shown in FIG. 5, a photoresist layer 510 is then placed over the silicon oxide layer 410. As shown in FIG. 6, the photoresist layer 510 is then patterned (using conventional techniques) to form an aperture 520 through the photoresist layer 510. As shown in FIG. 7, the silicon oxide layer 410 that is accessible through aperture 520 is then etched down to the top of the N epitaxial silicon layer 310.

Figure 8:
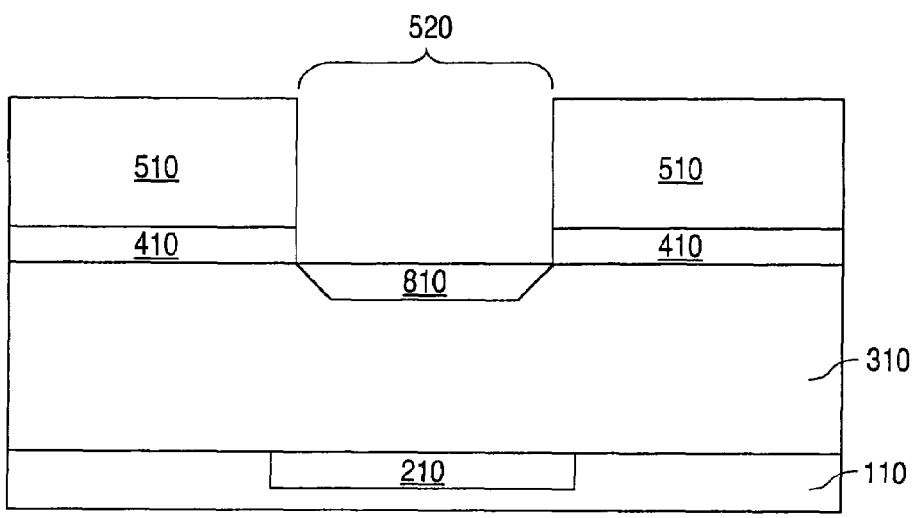

As shown in FIG. 8, a portion of the N epitaxial silicon layer 310 that is accessible through aperture 520 is then doped to create an N+ doped layer 810. The portions of photoresist layer 510 remain in place if the method of doping the N+ doped layer 810 is an implant method. The portions of photoresist layer 510 are removed if other doping methods are used to create the N+ doped layer 810.

Figure 9:
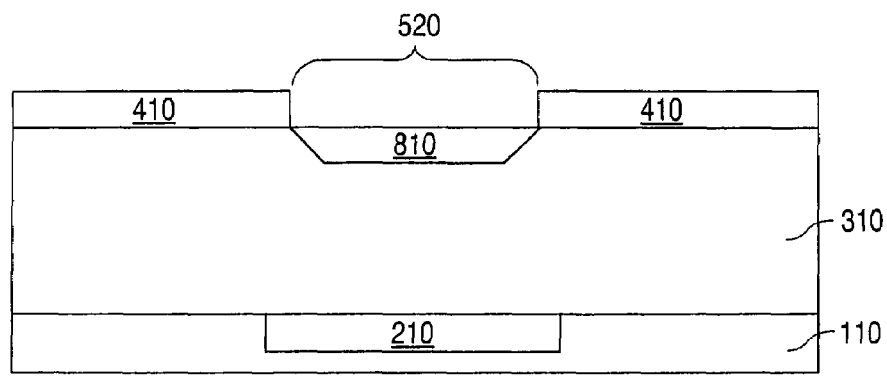

As shown in FIG. 9, the remaining portions of photoresist layer 510 are then removed if they were not previously removed during the doping that created the N+ doped layer 810.

Figure 10:
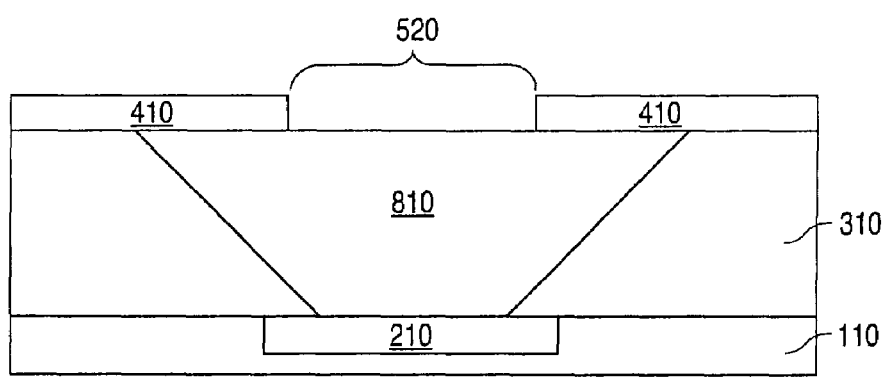

As shown in FIG. 10, the N+ doped layer 810 is then diffused from the surface down to the N+ buried layer 210. As the N+ doped layer 810 diffuses downwardly toward the N+ buried layer 210 the N+ doped layer 810 also diffuses laterally through the N epitaxial silicon layer 310.

The extent of the lateral diffusion is approximately seventy percent (70%) of the extent of the vertical diffusion. For example, if the distance of vertical diffusion is two microns (2.0 µm), then the distance of lateral diffusion is approximately one and four tenths micron (1.4 µm) per side. Therefore, if the width of the aperture 520 is one micron (1.0 µm), then the total top width of the diffusion is the sum of the following: one micron (1.0 µm) (for the width of aperture 520) plus one and four tenths micron (1.4 µm) (for the lateral diffusion of the first side) plus one and four tenths micron (1.4 μm) (for the lateral diffusion of the second side). The total top width of the diffusion is approximately three and eight tenths micron (3.8 μm).

The lateral diffusion of the N+ doped layer 810 in the prior art structure extends into a significant portion of the N epitaxial silicon layer 310. Therefore prior art structures must leave sufficient room to accommodate this type of lateral diffusion when a junction is driven down to a substrate or to a buried layer. In addition, prior art structures must leave sufficient room for depletion widths between heavily doped regions and adjacent electrical components.

The system and method of the present invention is capable of forming a deep connection to a substrate or to a buried layer in a semiconductor device in which less lateral space is required compared to prior art methods. In addition, the system and method of the present invention is capable of forming a deep connection to a substrate or to a buried layer in a semiconductor device in which less thermal budget is required compared to prior art methods.

Figure 11:
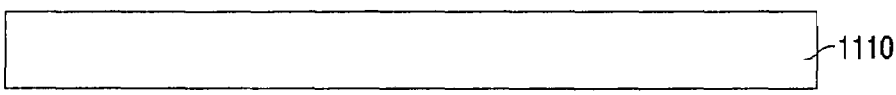
FIGS. 11 through 25 illustrate successive stages in the construction of a structure that forms a deep connection to a buried layer of a semiconductor device in accordance with the principles of the present invention.

FIGS. 11 through 25 illustrate successive stages in the construction of a structure that forms a deep connection to a buried layer in a semiconductor device in accordance with the principles of the present invention. As shown in FIG. 11, the construction of the structure of the present invention begins by providing substrate layer 1110.

Figure 12:
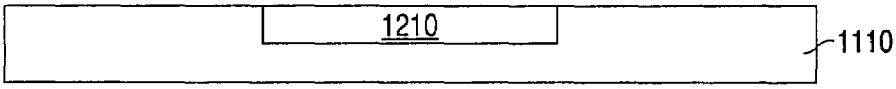

In the present example substrate 1110 comprises a wafer of P silicon. As shown in FIG. 12, a buried layer 1210 is formed in substrate 1110. In the present example buried layer 1210 comprises an N+ buried layer. The N+ buried layer 1210 is formed by conventional means such as photolithography and doping with optional etching and diffusion as needed.

Figure 13:
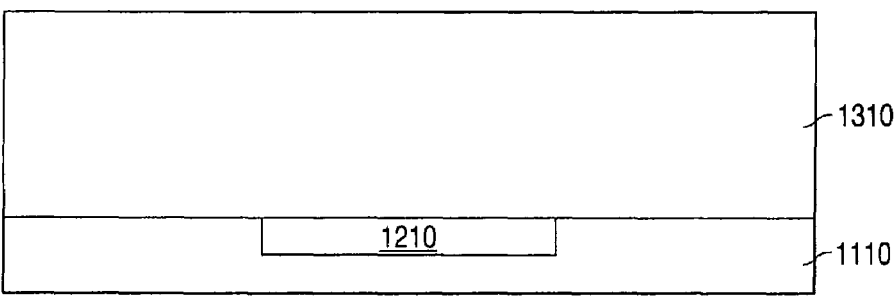
Figure 14:
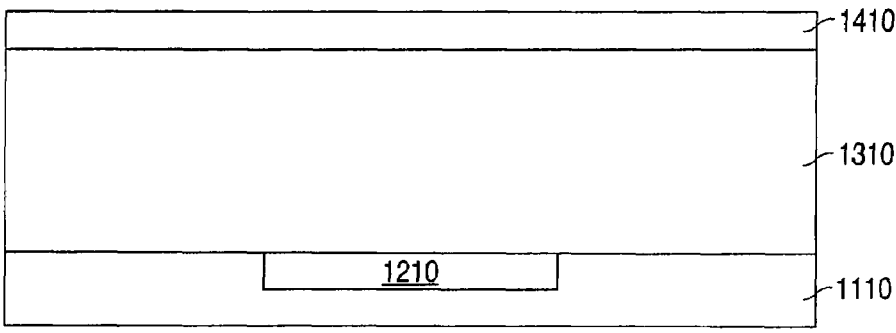

As shown in FIG. 13, an epitaxial silicon layer 1310 is placed over the substrate 1110 and buried layer 1210. In the present example the epitaxial silicon layer 1310 comprises an N epitaxial silicon layer. As shown in FIG. 14, a silicon oxide and nitride layer 1410 is placed over the N epitaxial silicon layer 1310. The placement of the silicon oxide and nitride layer 1410 over the N epitaxial silicon layer 1310 is an optional step.

Figure 15:
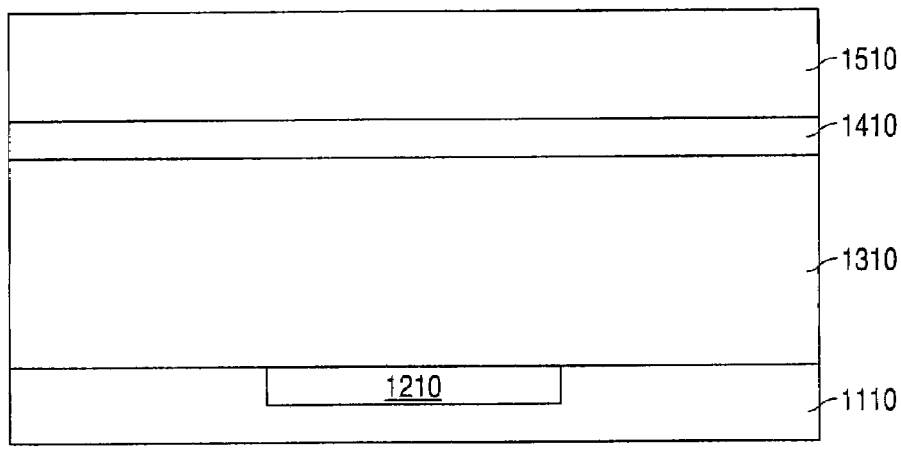
Figure 16:
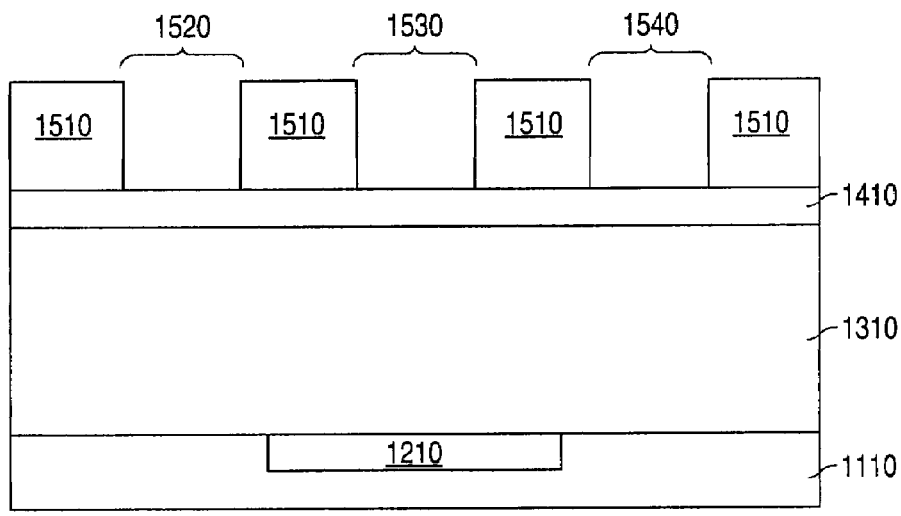

As shown in FIG. 15, a photoresist layer 1510 is then deposited over the silicon oxide and nitride layer 1410. As shown in FIG. 16, the photoresist layer 1510 is then patterned (using conventional techniques) to form apertures 1520, 1530 and 1540 through the photoresist layer 1510.

Figure 17:
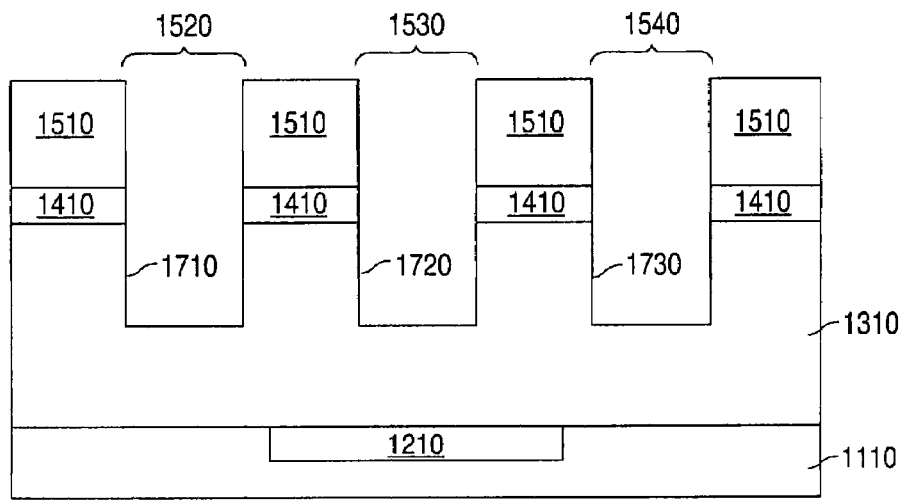

As shown in FIG. 17, shallow trenches 1710, 1720 and 1730 are then etched through the portions of the silicon oxide and nitride layer 1410 and the underlying N epitaxial silicon layer 1310 that are accessible through the apertures 1520, 1530 and 1540. In the present example the shallow trenches 1710, 1720 and 1730 are etched down to approximately one half of the thickness of the N epitaxial silicon layer 1310.

Figure 18:
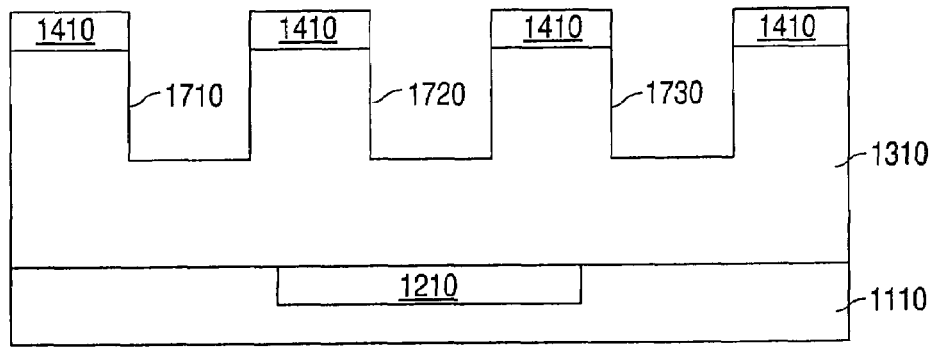
Figure 19:
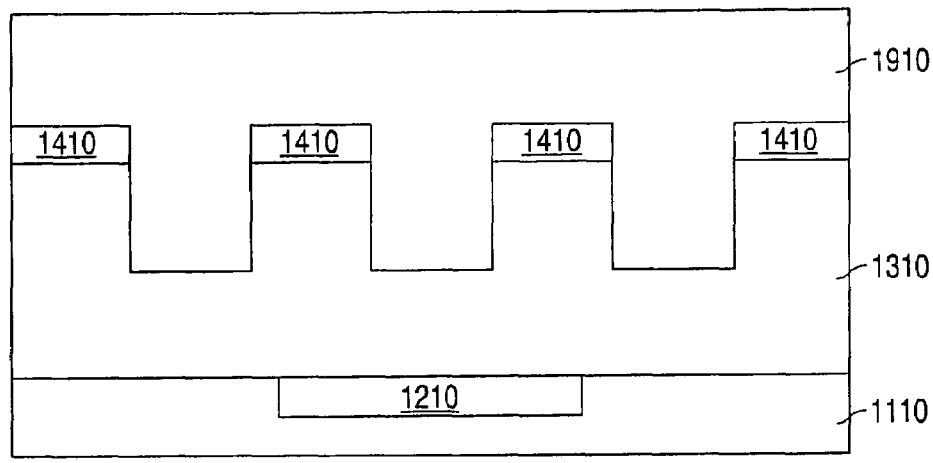

As shown in FIG. 18, the remaining portions of photoresist layer 1510 are then removed. As shown in FIG. 19, a new photoresist layer 1910 is then deposited.

Figure 20:
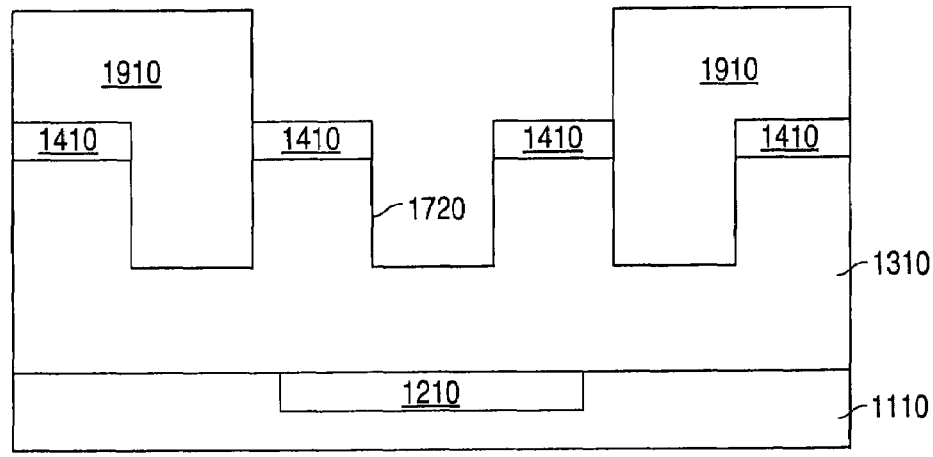

As shown in FIG. 20, the new photoresist layer 1910 is patterned (using conventional techniques) to create a deep collector in the manner described below. Portions of photoresist layer 1910 are removed from shallow trench 1720. Portions of photoresist layer 1910 are also removed from above the portions of the silicon oxide and nitride layer 1410 that are located on each side of shallow trench 1720. The portions of photoresist layer 1910 that fill shallow trench 1710 and shallow trench 1720 are not removed.

Figure 21:
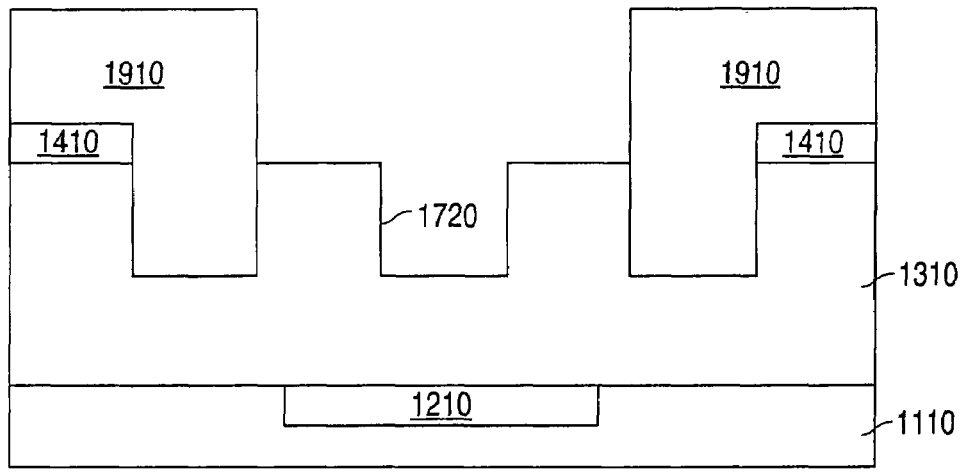

As shown in FIG. 21, the portions of the silicon oxide and nitride layer 1410 that are located on each side of shallow trench 1720 are then etched away. If ion implantation is to be used to create the doped layers described below, then the step of etching away the portions of the silicon and nitride layer 1410 is an optional step.

Figure 22:
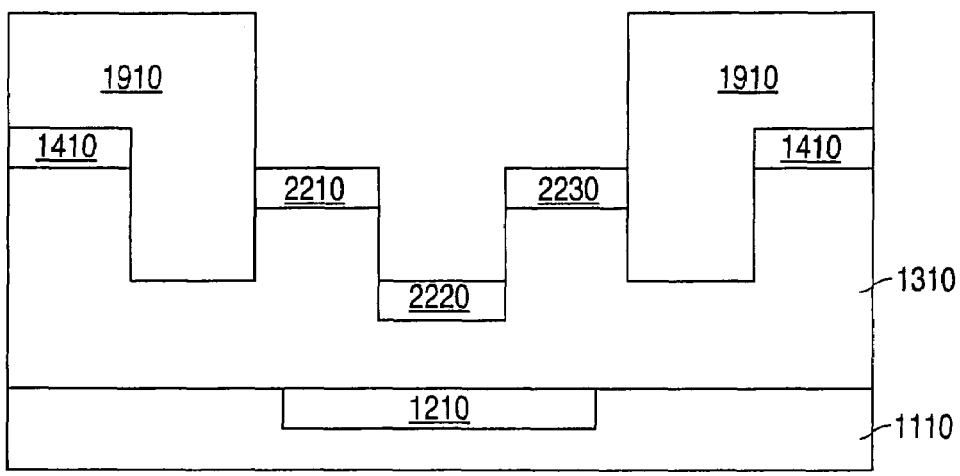

As shown in FIG. 22, then the exposed areas of the N epitaxial silicon layer 1310 are doped to create an N+ doped layer 2210, an N+ doped layer 2220, and an N+ doped layer 2230. N+ doped layer 2220 is formed from the portions of N epitaxial silicon-layer 1310 at the bottom of shallow trench 1720. N+ doped layer 2210 and N+ doped layer 2230 are formed from the portions of N epitaxial silicon layer 1310 that are located on each side of shallow trench 1720.

The portions of photoresist layer 1910 remain in place if the method of doping the N+ doped layers 2210, 2220 and 2230 is an implant method. The portions of photoresist layer 1910 are removed if other doping methods are used to create the N+ doped layers 2210, 2220 and 2230.

Figure 23:
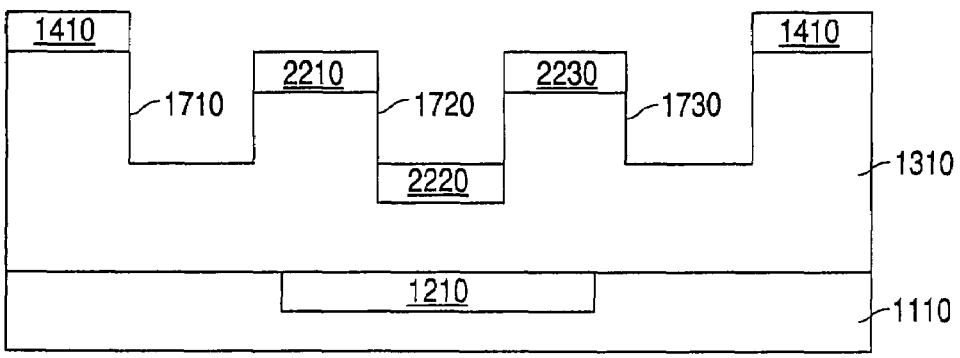

As shown in FIG. 23, the remaining portions of photoresist 1910 are then removed if they were not previously removed during the doping that created the N+ doped layers 2210, 2220 and 2230. The removal of the remaining portions of photoresist 1910 expose the previously filled shallow trenches 1710 and 1730.

Figure 24:
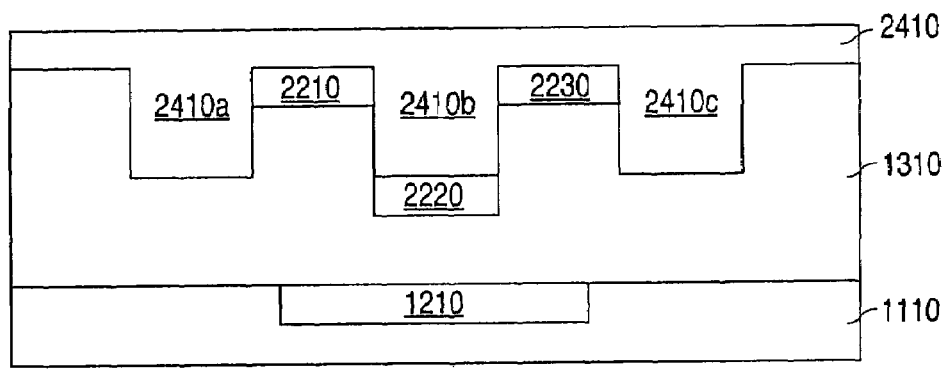

As shown in FIG. 24, an oxide layer 2410 is then applied to fill shallow trenches 1710, 1720 and 1730. The oxide layer is then planarized using conventional methods. A liner oxide (not shown) may also be applied before oxide layer 2410 is applied. Materials other than oxide layer 2410 may be used to fill shallow trenches 1710, 1720 and 1730. For example, nitride or oxide and polysilicon may be used.

The portion of oxide layer 2410 that fills shallow trench 1710 is designated with reference numeral 2410*a*. The portion of oxide layer 2410 that fills shallow trench 1720 is designated with reference numeral 2410*b*. The portion of oxide layer 2410 that fills shallow trench 1730 is designated with reference numeral 2410*c*.

As shown in FIG. 2.5, the N+ doped layers 2210, 2220 and 2230 are then diffused. The N+ doped layer 2220 is diffused from shallow trench 1720 down to the N+ buried layer 1210. The N+ doped layer 2210 diffuses downwardly toward the N+ buried layer 1210. The lateral diffusion of N+ buried layer 2210 is blocked on a first side by the presence of oxide layer 2410*a* and is blocked on a second side by the presence of oxide layer 2410*b*.

As the N+ doped layer 2220 diffuses downwardly toward the N+ buried layer 1210 the N+ doped layer 2220 also diffuses laterally through the N epitaxial silicon layer 1310. The lateral diffusion of the N+ doped layer 2220 meets the downwardly vertical diffusion of the N+ doped layer 2210.

Similarly, the N+ doped layer 2230 diffuses downwardly toward the N+ buried layer 1210. The lateral diffusion of N+ buried layer 2230 is blocked on a first side by the presence of oxide layer 2410*b* and is blocked on a second side by the presence of oxide layer 2410*c*. The lateral diffusion of the N+ doped layer 2220 meets the downwardly vertical diffusion of the N+ doped layer 2230.

Figure 25:
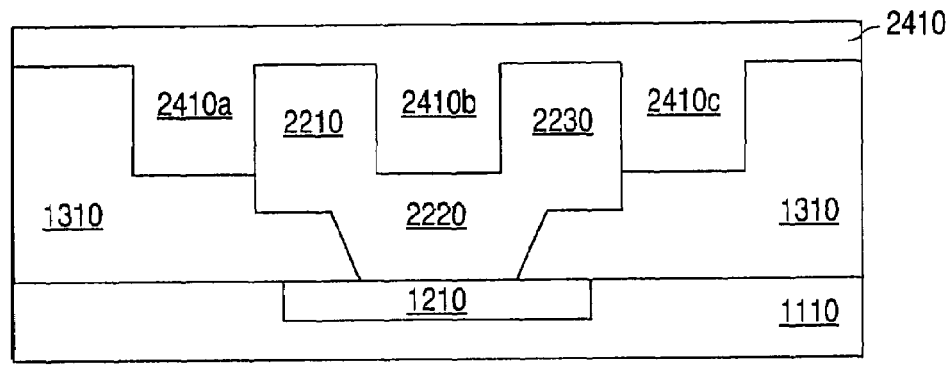

The resulting merged structure is composed of the three diffused N+ doped layers 2210, 2220 and 2230 as shown in FIG. 25. The three N+ doped layers 2210, 2220 and 2230 only need to diffuse about one half of the diffusion distance that was required in the prior art example. This example shows that the system and method of the present invention requires less thermal budget than that required by the prior art methods.

As previously mentioned, the presence of oxide layer 2410*a* in shallow trench 1710 and the presence of oxide layer 2410*b* in shallow trench 1720 blocks the lateral diffusion of N+ doped layer 2210. Similarly, the presence of oxide layer 2410b in shallow trench 1720 and the presence of oxide layer 2410c in shallow trench 1730 blocks the lateral diffusion of N+ doped layer 2230. The presence of the oxide layer 2410a and the oxide layer 2410c and the containment of the lateral diffusion of N+ doped layers 2210 and 2230 mean that no space is needed for depletion width.

The lateral diffusion of N+ doped layer 2220 connects N+ doped layer 2220 to the vertically diffused portions of N+ doped layers 2210 and 2230. The lateral diffusion of N+ doped layer 2220 does not extend beyond the outer vertical edges of the N+ doped layers 2210 and 2230. This example shows that the system and method of the present invention requires less lateral space than that required by the prior art methods.

Vias (not shown in FIG. 25) may be etched through portions of the oxide layer 2410 that are located over the N+ doped layers 2210 and 2230 in order to provide access for electrical contacts to the N+ doped layers 2210 and 2230.

In the illustrative example of the invention shown in FIGS. 11-25 the N+ doped layers 2210, 2220 and 2230 diffuse down to the buried layer 1210. It is understood that in an alternate embodiment doped layers of an appropriate doping type may diffuse from shallow trenches down to a substrate that does not contain a buried layer.

Figure 26:
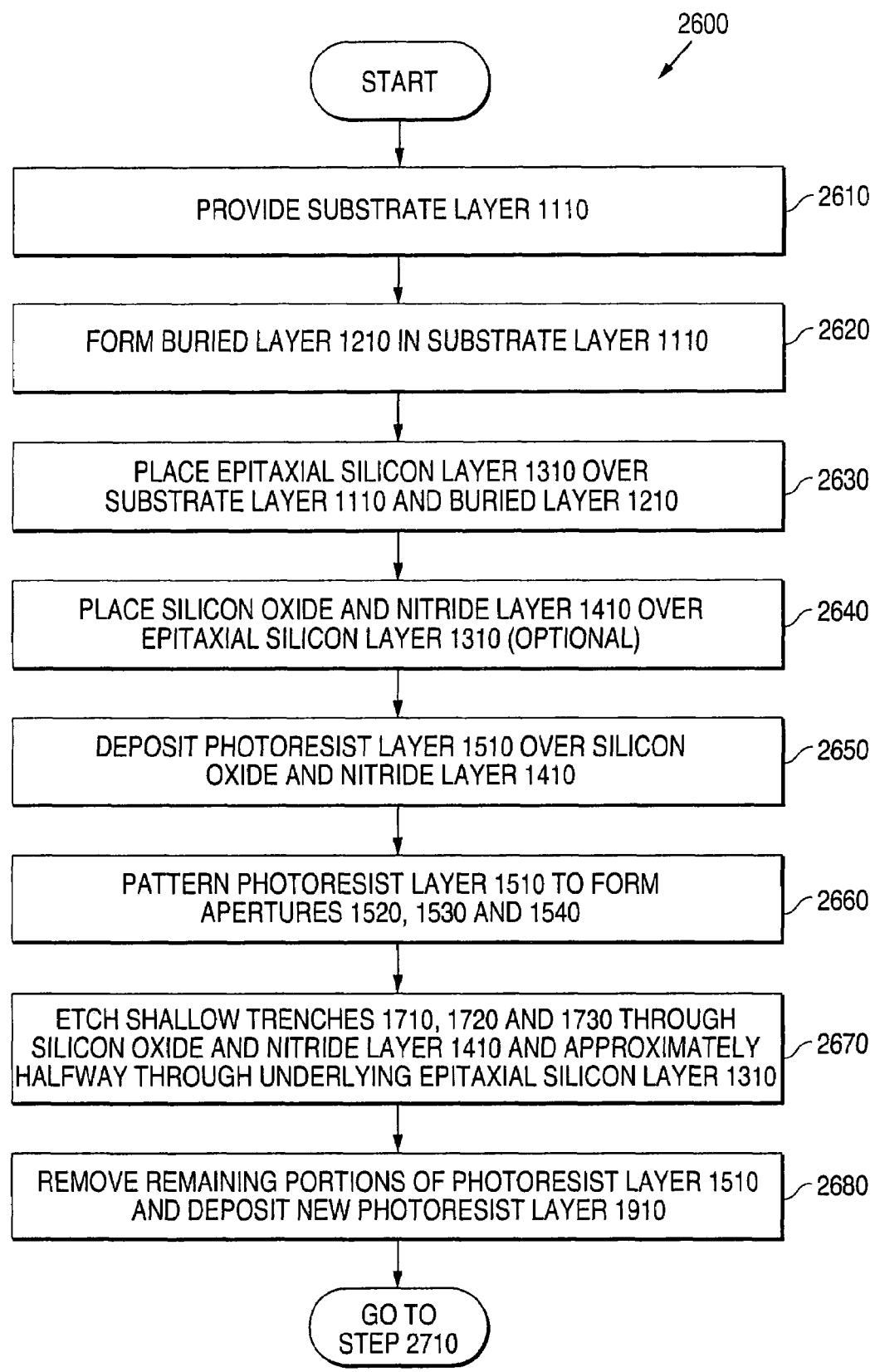
FIG. 26 illustrates a flow chart showing the steps of a first portion of an advantageous embodiment of the method of the present invention.

FIG. 26 illustrates a flow chart 2600 showing the steps of a first portion of an advantageous embodiment of the method of the present invention. The manufacture of a structure of the present invention for providing a deep connection to a buried layer in a semiconductor device begins by providing a substrate layer 1110 (step 2610). Then a buried layer 1210 is formed in substrate layer 1110 (step 2620). Then an epitaxial silicon layer 1310 is placed over the substrate 1110 and buried layer 1210 (step 2630). Then an optional silicon oxide and nitride layer 1410 is placed over the epitaxial silicon layer 1310. (step 2640).

Then a photoresist layer 1510 is deposited on the silicon oxide and nitride layer 1410 (step 2650). The photoresist layer 1510 is then patterned to form apertures 1520, 1530 and 1540 through the photoresist layer 1510 (step 2660). Then shallow trenches 1710, 1720 and 1730 are etched through the silicon oxide and nitride layer 1410 and approximately halfway through the underlying epitaxial silicon layer 1310 (step 2670). Then the remaining portions of photoresist layer 1510 are removed and a new photoresist layer 1910 is deposited (step 2680). Control then passes to step 2710 of FIG. 27.

Figure 27:
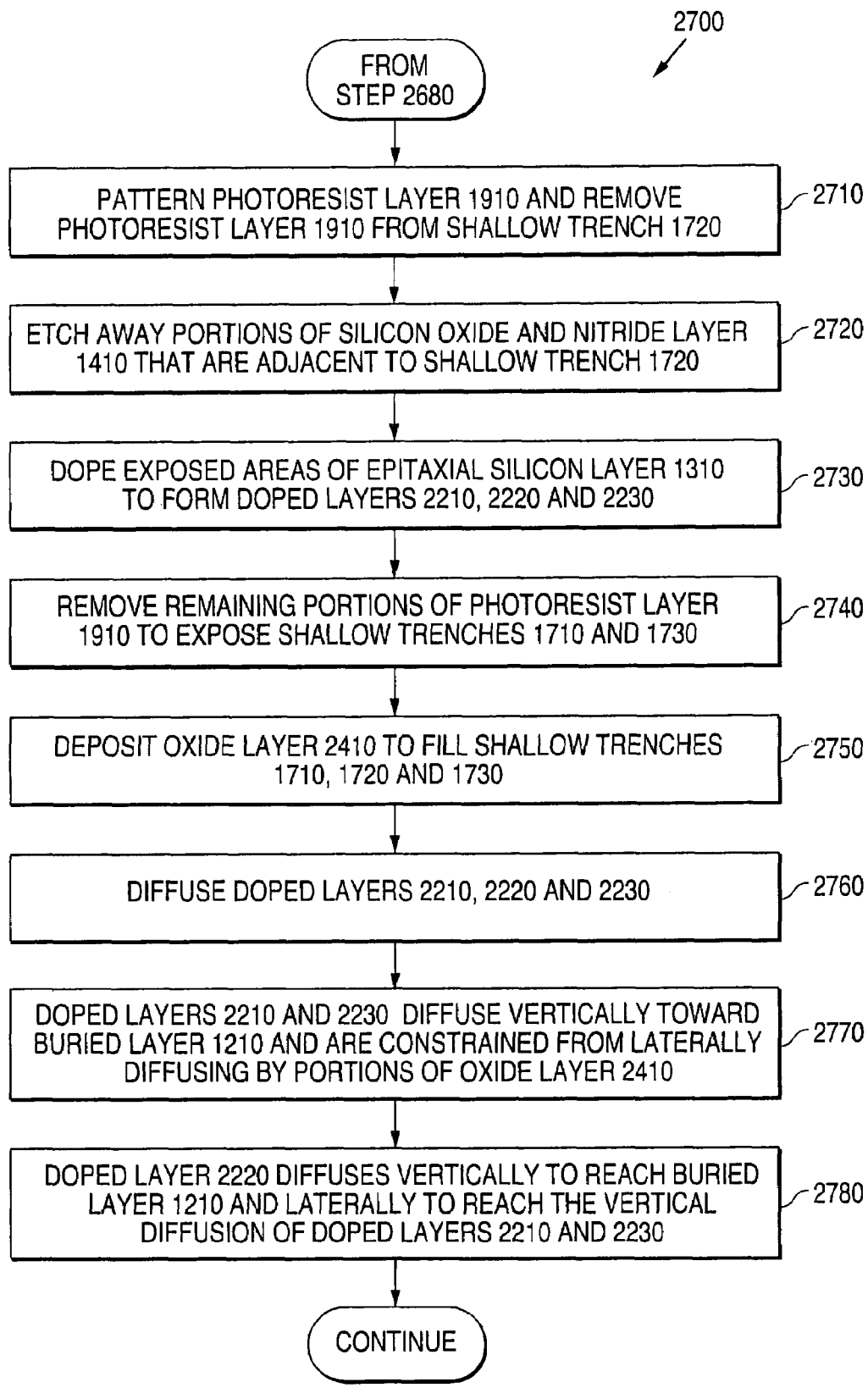
FIG. 27 illustrates a flow chart showing the steps of a second portion of an advantageous embodiment of the method of the present invention.

FIG. 27 illustrates a flow chart 2700 showing the steps of a second portion of an advantageous embodiment of the method of the present invention. Control passes to step 2710 from step 2680 of FIG. 26. Photoresist layer 1910 is patterned and the photoresist layer 1910 is removed from shallow trench 1720 (and from adjacent portions of silicon oxide and nitride layer 1410) (step 2710). Then the portions of silicon oxide and nitride layer 1410 that are adjacent to shallow trench 1720 are etched away (step 2720). Then the exposed areas of epitaxial silicon layer 1310 are doped to form doped layers 2210, 2220 and 2230 (step 2730).

Then the remaining portions of photoresist layer 1910 are removed to expose the shallow trenches 1710 and 1730 (step 2740). Then oxide layer 2410 is deposited to fill the shallow trenches 1710, 1720 and 1730 (step 2750). Then the doped layers 2210, 2220 and 2230 are diffused (step 2760). Doped layer 2210 and doped layer 2230 diffuse vertically toward the buried layer 1210 and are constrained from laterally diffusing by portions of the oxide layer 2410 (step 2770). Doped layer 2220 diffuses vertically to reach the buried layer 1210 and diffuses laterally to reach the vertical diffusion of doped layers 2210 and 2230 (step 2780). The method of the present invention forms a structure having a deep connection to buried layer 1210. In addition, the system and method of the present invention requires less lateral space and less thermal budget than prior art methods.

An exemplary embodiment of a structure of the present invention has been described for forming a deep connection that comprises a P silicon substrate, an N+ buried layer, an N epitaxial silicon layer, and N+ doped layers. Those persons who are skilled in the art will recognize that a structure that embodies the present invention may also be manufactured with elements of an opposite doping type.

An exemplary embodiment of a structure of the present invention has been described in which the shallow trenches 1710, 1720 and 1730 have been etched down to approximately one half of the thickness of the N epitaxial silicon layer 1310. It is understood that the value of one half of the thickness of the N epitaxial silicon layer 1310 is presented as merely one example. That is, other embodiments of the present invention may have etch depths for shallow trenches 1710, 1720 and 1730 that are more than one half the thickness or less than one half of the thickness of the underlying N epitaxial silicon layer 1310.

An exemplary embodiment of the present invention has been described in which an implant method has been used to dope the silicon. Those persons who are skilled in the art will recognize that other methods are available, including but not limited to, diffusion from a doped glass source, $POCl_3$, $BBr_3$, $BCl_3$, $PH_3$, furnace processing adjacent to a doped ceramic source, and other similar methods. Those persons who are skilled in the art will also recognize that these other doping methods require a masking layer capable of withstanding the doping temperature, most often a silicon dioxide, and a mask and etch step prior to the doping to remove the masking layer from the areas of silicon to be doped.

Although the present invention has been described with an exemplary embodiment, various changes and modifications may be suggested to one skilled in the art. It is intended that the present invention encompass such changes and modifications as fall within the scope of the appended claims.

What is claimed is:

1. A semiconductor device comprising:
   a substrate;
   an epitaxial silicon layer on said substrate;
   a first shallow trench, a second shallow trench, and a third shallow trench etched in said epitaxial silicon layer down through a first portion of a thickness of said epitaxial silicon layer;
   a first doped layer in said epitaxial silicon layer located between said first shallow trench and said second shallow trench;
   a second doped layer in said epitaxial silicon layer located at a bottom of said second shallow trench;
   a third doped layer in said epitaxial silicon layer located between said second shallow trench and said third shallow trench;
   an oxide layer that fills said first, second and third shallow trenches;
   wherein said second doped layer is diffused vertically down to contact said substrate and is diffused laterally into said epitaxial silicon layer; and
   wherein said first doped layer and said third doped layer are diffused vertically down to contact said second doped layer.

2. The semiconductor device as set forth in claim 1 further comprising:
   a silicon oxide and nitride layer placed over said epitaxial silicon layer.

3. The semiconductor device as set forth in claim 1 wherein:
   lateral diffusion of said first doped layer is constrained by said oxide layer in said first shallow trench; and
   lateral diffusion of said third doped layer is constrained by said oxide layer in said third shallow trench.

4. The semiconductor device as set forth in claim 1 wherein said first portion of said thickness of said epitaxial silicon layer is approximately one half of said thickness of said epitaxial silicon layer.

5. The semiconductor device as set forth in claim 1 wherein said first portion of said thickness of said epitaxial silicon layer is one of: (1) less than approximately one half of said thickness of said epitaxial silicon layer, and (2) more than approximately one half of said thickness of said epitaxial silicon layer.

6. The semiconductor device as set forth in claim 1 wherein said substrate comprises a P silicon material, and wherein said epitaxial silicon layer comprises an N epitaxial silicon layer, and wherein each of said first, second and third doped layers comprises a N+ doped layer.

7. The semiconductor device as set forth in claim 1 further comprising a buried layer in said substrate and wherein said second doped layer is diffused vertically down to contact said buried layer in said substrate.

8. A semiconductor device comprising:
   a substrate;
   an epitaxial silicon layer on the substrate;
   a first shallow trench, a second shallow trench, and a third shallow trench in the epitaxial silicon layer;
   an oxide layer that fills the first, second and third shallow trenches; and
   a doped region of the epitaxial silicon layer comprising a first portion between the first and second shallow trenches, a second portion below the second shallow trench, and a third portion between the second and third shallow trenches,
   wherein the first, second and third portions of the doped region are contiguous and the doped region contacts the substrate.

9. The semiconductor device as set forth in claim 8, wherein:
   the first portion of the doped region comprises substantially all of the epitaxial silicon layer between the first and second shallow trenches;
   the second portion of the doped region comprises substantially all of the epitaxial silicon layer below the second shallow trench; and
   the third portion of the doped region comprises substantially all of the epitaxial silicon layer between the second and third shallow trenches.

10. The semiconductor device as set forth in claim 8, wherein a depth of the second shallow trench is approximately one half of a thickness of the epitaxial silicon layer.

11. The semiconductor device as set forth in claim 8, wherein:
   the substrate comprises a P silicon material;
   the epitaxial silicon layer comprises an N epitaxial silicon layer; and
   the doped region comprises a N+ doped layer.

12. The semiconductor device as set forth in claim 11, further comprising an N+ buried layer in the substrate, wherein the doped region contacts the buried layer.

13. The semiconductor device as set forth in claim 8, further comprising a buried layer in the substrate, wherein the doped region contacts the buried layer.

14. The semiconductor device as set forth in claim 8, further comprising an opening in the oxide layer providing access for an electrical contact to the doped region.

15. A semiconductor wafer comprising:
   a substrate; and
   a plurality of semiconductor devices, wherein at least one semiconductor device of the plurality of semiconductor devices comprises:
     an epitaxial silicon layer on the substrate;
     a first shallow trench, a second shallow trench, and a third shallow trench in the epitaxial silicon layer;
     an oxide layer that fills the first, second and third shallow trenches; and
     a doped region of the epitaxial silicon layer comprising a first portion between the first and second shallow trenches, a second portion below the second shallow trench, and a third portion between the second and third shallow trenches,
     wherein the first, second and third portions of the doped region are contiguous and the doped region contacts the substrate.

16. The semiconductor wafer as set forth in claim 15, wherein:
   the first portion of the doped region comprises substantially all of the epitaxial silicon layer between the first and second shallow trenches;
   the second portion of the doped region comprises substantially all of the epitaxial silicon layer below the second shallow trench; and
   the third portion of the doped region comprises substantially all of the epitaxial silicon layer between the second and third shallow trenches.

17. The semiconductor wafer as set forth in claim 15, wherein a depth of the second shallow trench is approximately one half of a thickness of the epitaxial silicon layer.

18. The semiconductor wafer as set forth in claim 15, wherein:
   the substrate comprises a P silicon material;
   the epitaxial silicon layer comprises an N epitaxial silicon layer; and
   the doped region comprises a N+ doped layer.

19. The semiconductor wafer as set forth in claim 18, wherein:
   the semiconductor device further comprises an N+ buried layer in the substrate; and
   the doped region contacts the buried layer.

20. The semiconductor wafer as set forth in claim 15, wherein:
   the semiconductor device further comprises a buried layer in the substrate; and
   the doped region contacts the buried layer.

21. The semiconductor wafer as set forth in claim 15, wherein the semiconductor device further comprises an opening in the oxide layer providing access for an electrical contact to the doped region.

* * * * *